United States Patent [19]
Adams et al.

[11] Patent Number: 5,796,745
[45] Date of Patent: Aug. 18, 1998

[54] MEMORY ARRAY BUILT-IN SELF TEST CIRCUIT FOR TESTING MULTI-PORT MEMORY ARRAYS

[75] Inventors: Robert D. Adams, Essex Junction; John Connor, Burlington; Garrett S. Koch, Cambridge; Luigi Ternullo, Jr., Colchester, all of Vt.

[73] Assignee: International Business Machines Corporation, Armonk, N.Y.

[21] Appl. No.: 684,519

[22] Filed: Jul. 19, 1996

[51] Int. Cl.$^6$ .................................................. G01R 31/28
[52] U.S. Cl. .................. 371/21.1; 371/22.5; 395/183.06
[58] Field of Search .......................... 371/21.1, 27, 22.3, 371/22.5, 25.1, 27.1, 27.2, 27.5, 21.2; 395/183.06, 183.03, 182.08, 182.03; 365/201

[56] References Cited

U.S. PATENT DOCUMENTS

| | | |
|---|---|---|
| Re. 34,445 | 11/1993 | Hayes et al. |
| 4,949,341 | 8/1990 | Lopez et al. |
| 5,006,787 | 4/1991 | Katircioglu et al. |
| 5,138,619 | 8/1992 | Fasang et al. |
| 5,173,906 | 12/1992 | Dreibelbis et al. .............. 371/22.5 |
| 5,224,101 | 6/1993 | Popyack, Jr. |
| 5,289,403 | 2/1994 | Yetter |
| 5,301,156 | 4/1994 | Talley |
| 5,301,199 | 4/1994 | Ikenaga et al. |
| 5,309,447 | 5/1994 | Moskowitz et al. |
| 5,331,643 | 7/1994 | Smith |
| 5,388,104 | 2/1995 | Shirotori et al. ............... 371/21.1 |
| 5,394,403 | 2/1995 | Klein .............................. 371/21.1 |
| 5,416,783 | 5/1995 | Broseghini et al. ............. 371/22.3 |
| 5,475,815 | 12/1995 | Byers et al. .................... 395/183.08 |
| 5,553,082 | 9/1996 | Connor et al. .................. 371/25.1 |
| 5,577,050 | 11/1996 | Bair et al. ....................... 371/10.2 |
| 5,617,531 | 4/1997 | Crouch et al. .................. 395/183.06 |

*Primary Examiner*—Robert W. Beausoliel, Jr.
*Assistant Examiner*—Nadeem Iqbal
*Attorney, Agent, or Firm*—Schmeiser, Olsen & Watts; Eugene I. Shkurko

[57] ABSTRACT

A memory Array Built-In Self-Test (ABIST) circuit is disclosed that will test a multi-port memory array. A programmable pattern generator for the ABIST circuit allows for different R/W data operations to be performed at the same or adjacent address locations within a multi-port memory array. The programmable pattern generator comprises a data generator, a read/write controller, and an address counter, each having the same number of outputs as ports of the multi-port memory array. The programmable pattern generator also comprises a frequency controller. The data generator is programmed with the appropriate data patterns for the memory array, and the read/write controller is programmed with the appropriate read/write patterns for the memory array. The address counter is to provide the same or different addresses on each port of the multi-port array, and the frequency controller is programmed with the appropriate frequency information to determine the number of read/write operations per cell in the memory array. The combination of programmable data, programmable read/write sequences, programmable address counter, and programmable frequency allows for determistic testing of a multi-port memory array, a plurality of single-port memory arrays, or a combination thereof by providing unique read/write sequences to the same or to adjacent memory locations.

20 Claims, 4 Drawing Sheets

MEMORY ARRAY BUILT-IN SELF TEST CIRCUIT FOR TESTING MULTI-PORT MEMORY ARRAYS

CROSS-REFERENCE TO RELATED APPLICATION

This application is related to a co-pending application Dkt. No. BU9-95-035 filed Jun. 7, 1995 as U.S. Ser. No. 08/485,296 entitled "MEMORY ARRAY BUILT-IN SELF-TEST CIRCUIT HAVING A PROGRAMMABLE PATTERN GENERATOR FOR ALLOWING UNIQUE READ/WRITE OPERATIONS TO ADJACENT MEMORY CELLS, AND METHOD THEREFOR," which is herein incorporated by reference.

BACKGROUND OF THE INVENTION

1. Technical Field

The invention relates generally to testing of integrated circuits, and more specifically, to built-in self-test circuits and methods implemented on an integrated circuit chip to test the function of a portion of the integrated circuit, such as a memory array.

2. Background Art

Advances in integrated circuits have enhanced the ability to integrate increasingly more circuits on a single chip. As the circuit complexity on a chip increases, so does the need to thoroughly test the circuits. However, many of these circuits have few or no connections that are accessible to external test equipment, making the direct testing of these circuits by external equipment very difficult or impossible altogether. A general solution to the problem of testing integrated circuits is to embed test circuitry on the chip itself, commonly known as Built-In Self-Test (BIST) circuits. In particular, the testing of memory incorporated into a logic chip is commonly performed with Array Built-In Self-Test (ABIST) circuits that test the functionality of an on-chip memory array and provides a failure indication if the memory array is not operating properly.

As the number of circuits integrated onto a single chip increases, the complexity and sophistication of on-chip self-test circuits also increases. A variety of different types of self-test circuits are known for different applications. One such type of self-test circuit generates a random data pattern to apply to the memory array. Examples of random data self-test circuits include: U.S. Pat. No. 5,331,643 "Self-Testing Logic with Embedded Arrays" (issued Jul. 19, 1994, to Smith and assigned to IBM); U.S. Pat. No. 5,301,199 "Built-In Self Test Circuit" (issued Apr. 5, 1994, to Ikenega et al. and assigned to national Semiconductor Corp.); and U.S. Pat. No. 5,006,787 "Self-Testing Circuitry for VLSI Units" (issued Apr. 9, 1991, to Katircioglu et al. and assigned to Unisys Corp.).

Self-test circuits that generate random data, such as those listed above, cannot be used for deterministic testing of a memory array, i.e., to test the array with a defined sequence of data. In addition, random data cannot place the memory array in a known state, which is required, for example, during Static Voltage Screen (SVS) testing. However, other self-test circuits are known which generate programmable data. Examples of programmable data self-test circuits include: U.S. Pat. No. 5,224,1010 "Micro-Coded Self-Test Apparatus for a Memory Array" (issued Jun. 29, 1993, to Popyack, Jr. and assigned to the United States); U.S. Pat. No. 5,301,156 "Configurable Self-Test for Embedded Rams" (issued Apr. 5, 1994, to Talley and assigned to Hewlett Packard Co.); and U.S. Pat. No. 5,173,906 "Built-In Self Test for Integrated Circuits" (issued Dec. 22, 1992, to Dreibelbis et al.).

Although the patents above generate programmable data for testing memory arrays, there are some disadvantages using these circuits. Some of these disadvantages include: fixing the programmable data once it is programmed into memory (U.S. Pat. No. 5,224,1010); scanning test vectors into memory, which creates a time-consuming test especially for large memory arrays (U.S. Pat. No. 5,301,156); and failing to stop the ABIST circuit when the memory array is in a known state (U.S. Pat. No. 5,173,906). Furthermore, only single-port memory arrays are tested in the aforementioned patents. Using the patents on a multi-port memory, such as on a dual port Random Access Memory (RAM), would not thoroughly or completely test the multi-port memory array. When using the prior art in testing a multi-port memory array, either 1) only one port could be tested at a time, thus not providing a simultaneous and thorough testing of the multiple ports, or 2) a plurality of ABIST circuits would have to be used to simultaneously apply unique Read/Write (R/W) data sequences to all memory ports. Not only would a plurality of ABIST circuits take up space, but the disadvantages associated with the testing of a single-port memory array would also apply in the testing of a multi-port memory array. More specifically, multi-port memories would have different fault models and test algorithms than single-port memories. Thus, more flexible test algorithms must be obtained to test multi-port memories.

Accordingly, a need has developed in the art for a single ABIST circuit that will simultaneously and thoroughly test multiple ports on a multi-port memory array, a plurality of single ports on single-port memory arrays, or a combination thereof.

SUMMARY OF THE INVENTION

It is thus an advantage of the present invention to provide a single memory array built-in self test circuit that simultaneously tests multiple ports on a multi-port memory array.

The foregoing and other advantages of the invention are realized by an ABIST circuit that will check the function of a plurality of ports simultaneously. A programmable pattern generator in the ABIST circuit allows for different Read/Write (R/W) data operations to be performed at the same or adjacent address locations within a multi-port memory array. The programmable pattern generator comprises a data generator, a read/write controller, and an address counter, each having the same number of outputs as ports of the multi-port memory array. The programmable pattern generator also comprises a frequency controller, which provides the clock signal to the address counter.

The data generator is programmed with the appropriate data patterns for the memory array, and the read/write controller is programmed with the appropriate read/write patterns for the memory array. The address counter is programmed to invert or not invert specific port address bits, and the frequency controller is programmed with the appropriate frequency information to determine the number of read/write operations performed at each memory address. The combination of programmable data, programmable read/write sequences, and the ability to program whether each port receives the same address or different addresses allows for deterministic testing of a multi-port memory array, or even several single port memory arrays, by providing unique read/write sequences to the same and to adjacent cells. The programmable pattern generator provides a far greater number of possible combinations than the prior art, allowing for more rigorous testing of port arbitration and memory address sensitivities (including cell-to-cell, bitline-to-bitline, and wordline-to-wordline coupling sensitivities).

The foregoing and other objects, features, and advantages of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
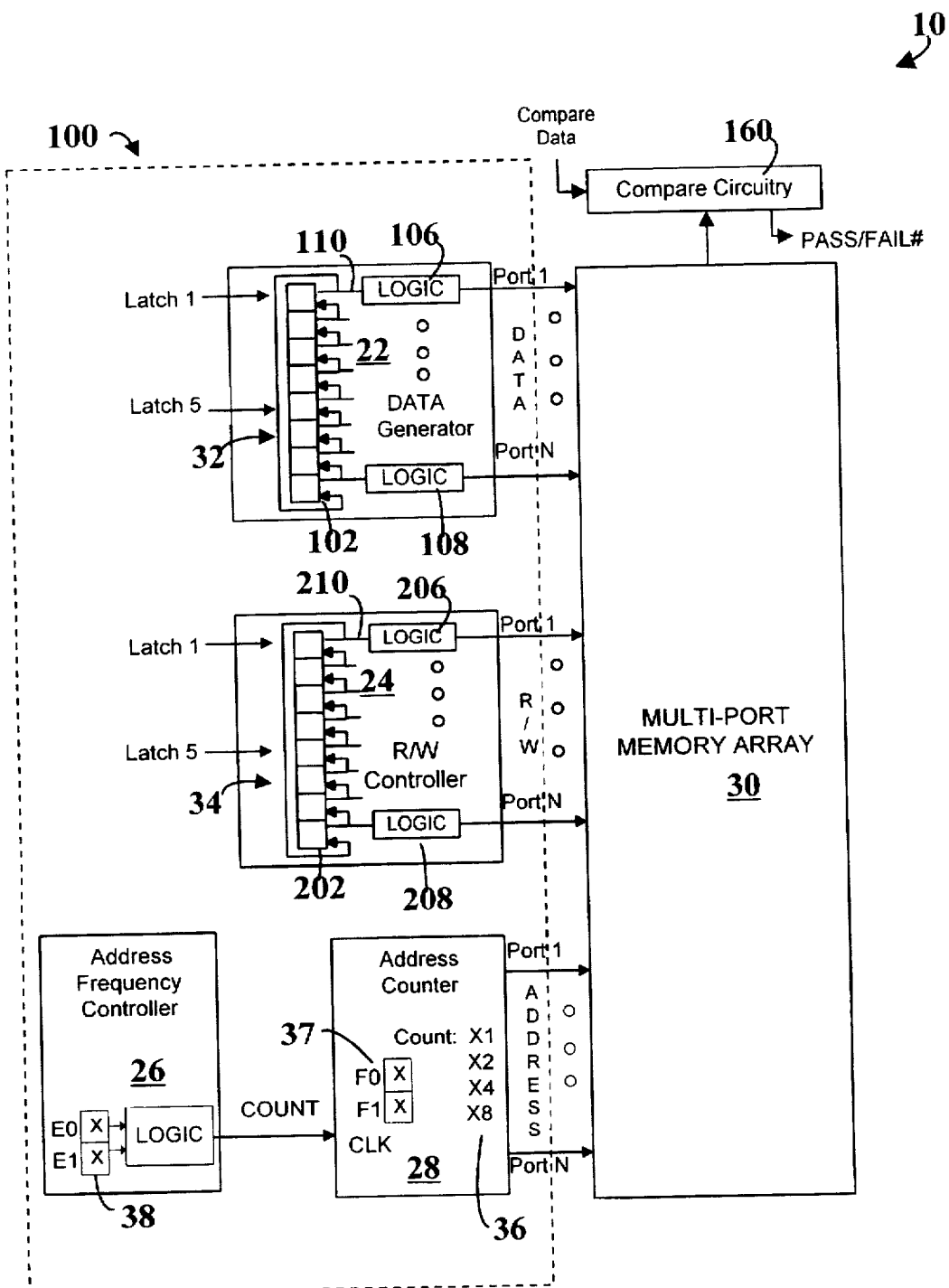
FIG. 1 is a block diagram of a programmable pattern generator for an ABIST circuit in accordance with a preferred embodiment of the present invention.

Referring to FIG. 1, an ABIST circuit on an integrated circuit 10 in accordance with the present invention includes a programmable pattern generator circuit 100 and compare circuitry 160 for testing a multi-port memory array 30. Although a multi-port memory array is shown, several single port memory arrays may also be tested, or a combination thereof and are within the scope of this invention. Pattern generator 100 comprises a data generator 22, a read/write (R/W) controller 24, an address counter 28, and an address frequency controller 26. Data read from memory array 30 is compared against compare data using compare circuitry 160, which generates a PASS/FAIL# signal to indicate whether the comparison succeeded. The configuration of data generator 22, R/W controller 24, and address counter 28, along with the presence of address frequency controller 26, significantly enhances the operation of programmable pattern generator 100 when compared with the prior art by providing the capability of simultaneously applying unique R/W patterns to the memory array's multiple ports Port 1 through Port N to access the same memory cells (testing port arbitration) or to access adjacent memory addresses (testing cell-to-cell, bitline-to-bitline or wordline-to-wordline coupling sensitivities) within memory array 30.

Data generator 22 generates the data to be read or written during testing on its DATA outputs to memory array 30 through Ports 1 through N. Data generator 22 comprises an eight bit data latch 32 arranged in a shift register configuration and coupled to logic circuits 106, 108, etc. Although data generator 22 is shown as an eight bit data latch, one skilled in the art recognizes that a larger (e.g., 32-bit, 64-bit) or smaller bit data latch could be used to best facilitate the memory array being tested. The number of logic circuits and corresponding DATA outputs of data generator 22 are configured to correspond to the number of memory array ports. Thus, data may be read simultaneously from a plurality of the shift registers' latch bits (e.g., from two latch bits, latch 1 and latch 5, if memory array 30 is a dual port memory), and may be used to simultaneously test port arbitration or memory address sensitivity in memory array 30. Initial data values for data generator 22 are stored in data register 32 using known methods of scan chain initialization. The output 110 of the least significant bit (latch 1) of data register 32 may be coupled to the input of the most significant bit 102 to form a barrel shifter, so the data pattern stored in data generator 22 during scan chain initialization may be preserved and used repetitively throughout the test.

Read/write (R/W) controller 24 generates the read and write control signals R/W to memory array's multiple ports, ports 1-N, during testing. R/W controller 24 comprises an eight bit R/W latch 34 arranged in a shift register configuration. Although R/W controller 24 is shown as an eight bit data latch, one skilled in the art recognizes that a larger (e.g., 32-bit, 64-bit) or smaller bit data latch could be used to best facilitate the multi-port memory array being tested. Initial values for R/W controller 24 are stored in R/W register 34 via scan chain initialization. The output 210 of the least significant bit (latch 1) of R/W register 34 is coupled to the input of the most significant bit 202, forming a barrel shifter similar to data register 32. As with the data generator 32, the number of logic circuits 206, 208, etc. and corresponding R/W outputs of R/W controller 24 are configured to correspond to the number of memory array ports.

Address counter 28 generates ADDRESS outputs to the address line inputs of memory array 30 during testing. Address counter 28 comprises a binary counter with a clock input CLK driven by the COUNT output of address frequency controller 26. Address counter 28 also comprises programmable latches 37, F0 and F1, which can be set during scan chain initialization to invert various port (P1 to PN) address bits. For example, the least significant bit (LSB) of the word line address on Port 1 can be inverted by programming the appropriate values into the address counter's programmable latches. Thus, wordline-to-wordline sensitivities may be tested. If the latches are programmed in this manner, then Port 1 can output a different address than Ports 2 through N.

Address frequency controller 26 determines when to pulse its COUNT output to cause address counter 28 to drive the next addresses to memory array 30. The frequency of COUNT determines how many of the eight programmed R/W cycles are performed on a cell before the address is changed. COUNT may be pulsed either on every memory cycle, every other memory cycle, every fourth memory cycle, or every eighth memory cycle, depending on the state of two encode inputs E0 and E1, which are set by scan chain initialization. Although four frequencies are implemented as described, one skilled in the art should recognize that other methods and logic may be used that allow for other appropriate frequencies. X1 may be effected by initializing both E0 and E1 to "0". In X1 mode, COUNT pulses once every memory cycle, causing address counter 28 to change the various port addresses provided to memory array 30 every cycle. Thus, in X1 mode, only one R/W operation is performed to each cell addressed.

X2 mode may be effected by initializing E0 to "0" and E1 to "1". In X2 mode, COUNT pulses once for every two memory cycles, causing address counter 28 to change address on every other cycle. Thus, in X2 mode, two R/W operations are performed sequentially on each cell addressed. X4 mode may be effected by initializing E0 to "1" and E1 to "0". In X4 mode, COUNT pulses once for every four memory cycles, causing address counter 28 to change address every fourth access to memory array 30. Thus, in X4 mode, four R/W operations are performed on each cell addressed. X8 mode may be suitably effected by initializing both E0 and E1 to "1". In X8 mode, COUNT pulses once for every eight memory cycles, causing address counter 28 to change its port addresses every eighth access to memory array 30. Thus, in X8 mode, all eight R/W operations defined by data generator 22 and R/W controller 24 are performed on each cell addressed.

Figure 2:
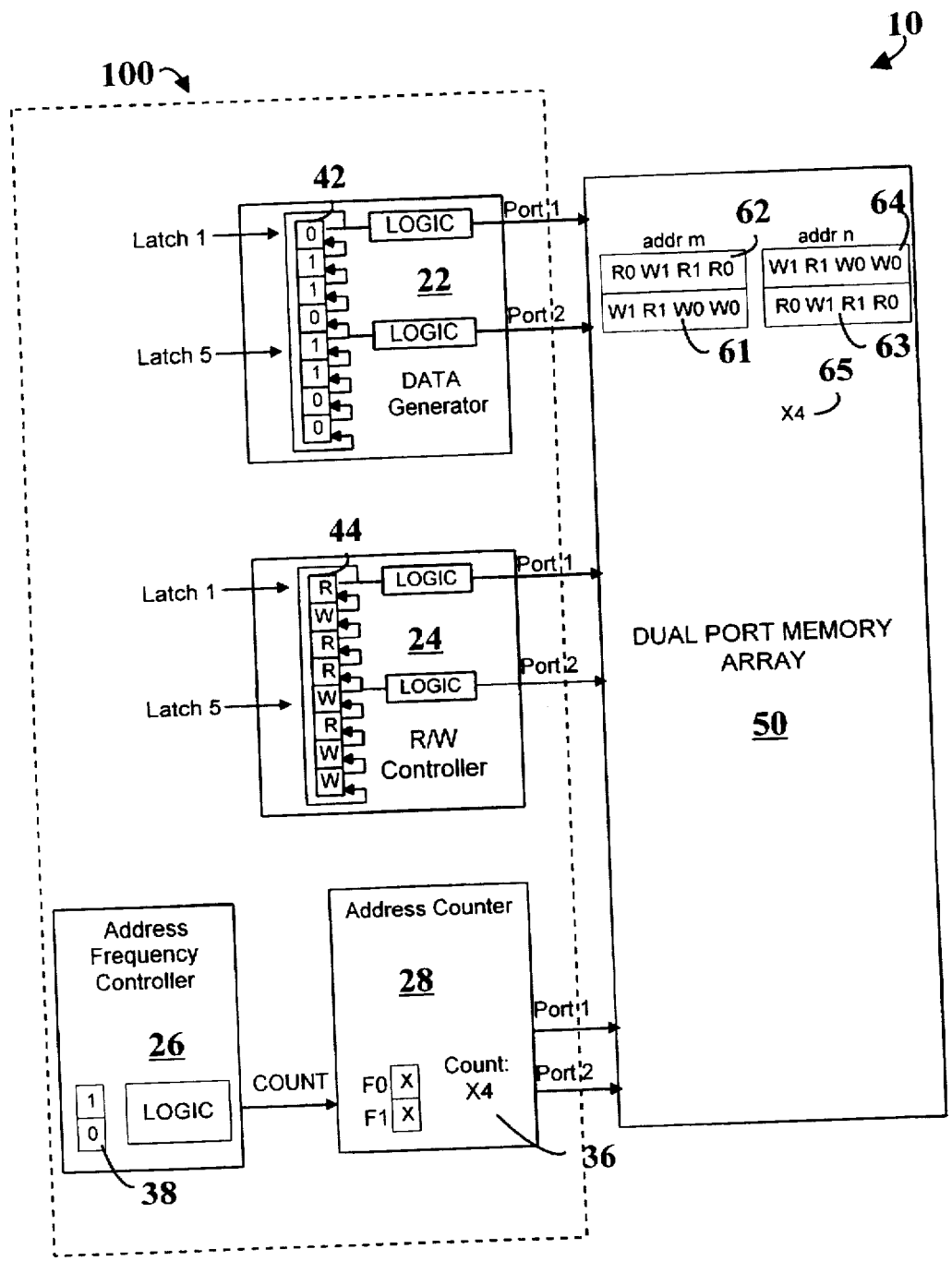
FIG. 2 is a block diagram illustrating one specific implementation of the programmable pattern generator of FIG. 1 to check memory port arbitration.

FIG. 2 illustrates testing a dual port memory array 50 for port arbitration in accordance with an embodiment of the present invention. Port arbitration for a dual port memory array 50 is tested by simultaneously applying R/W operations to the same address through ports 1 and 2, and comparing the results of the operations to compare data. The compare data supplied to the compare circuitry 160 is a function of five elements: port arbitration, data output bus structure, port address, port read/write controls, and port data. Therefore, one skilled in the art would design customized logic that takes into account port arbitration and data output bus structure employed in the particular memory under test as well as the inputs from the data generator, the read/write controller, and the address counter in order to generate the correct Compare Data for a particular set of inputs.

Port arbitration, one of the elements in determining the value for the Compare Data, defines both the port and the function priority employed in a particular memory array. For instance, in the design of a dual port memory, Port 1 might be given priority over Port 2 and read functions might be performed before write functions.

The data output bus structure, another element in determining the Compare Data value, can consist of a single port or multiple ports. If multiple output ports exist then the memory can support multiple read instructions on various ports. If only one output bus is present, then the data read out is in response to the port that has the highest priority.

Suppose the array under test is a dual port memory that supports read-modify-write operation, has only one output bus, and Port 1 has priority over Port 2 operation. In cases where each port is addressing a different portion of memory, there is generally no contention between ports and arbitration is not needed. For instance, if the instructions 'P1R0 at addr m' (read "Port 1 Read 0 at address m") and 'P2W1 at addr n' are simultaneously applied to the memory under test, then it is expected that a "0" will be read out on the memory's data output bus from address m while a "1" is written to address n. Therefore, the Compare Data generator (not shown) will provide a "0" to the compare circuitry 160. Similar results will occur if instructions 'P1W0 at addr m' and 'P2R1 at addr n' are carried out except that a "1" will be generated as the Compare Data. In the case where the port instructions are 'P1W1 at addr m' and 'P2W0 at addr n' then two write operations are performed and the Compare Data value can be set to a "don't care." Port arbitration comes into play when two read operations are requested in the same cycle: 'P1R0 at addr m' and 'P2R1 at addr n'. Since the memory employed in this example has only one data output bus, only one of the two port operations can be performed, which is the 'P1R0 at addr m' instruction since Port 1 has priority. In this case, the Port 2 instruction will be ignored and the compare data generator will output a "0".

The case where port addresses are the same is now examined. When each port is operating on the same address, 'P1R0 at addr z' and 'P2W1 at addr z', the Port 1 Read 0 operation is carried out first followed by the late write operation requested on Port 2 since the memory supports read operations followed by write operations. In this case, the compare data generator would output a "0". Similar results would occur in the case of a 'P1W0 at addr z' and 'P2R1 at addr z' with the exception that the compare data generator outputs a "1". In the case where the port instructions are 'P1R1 at addr z' and 'P2R0 at addr z', the contents of the memory cell or cells at address z are read out since Port 1 has priority over Port 2 and the compare data generator outputs a "1". Finally, suppose two write operations are performed to the same address, 'P1W0 at addr z' and 'P2W1 at addr z'. Under this scenario, a "0" is written to address z and the Port 2 instruction is ignored. In this last case, the compare data generator can output a "don't care" since no data is read out of memory.

Continuing with the FIG. 2 example, the read operation has priority when simultaneous operations are applied to the same address location. Each programmable shift register 42 and 44 has two outputs, corresponding to the number of ports of the dual port memory array. In this example, one set of outputs is taken from Latch 1 of shift registers 42 and 44, and the other from Latch 5 of shift registers 42 and 44. The outputs of Latch 1 may be fed into Port 1 while the outputs of latch 5 are fed into Port 2, thus allowing simultaneous operations on the same address cell from both ports with unique R/W data sequences.

In this example, the frequency controller is in X4 mode. Thus, the first four read/write operations from Port 1 and Port 2 (62 and 61, respectively) are performed simultaneously at the same address location addr m in four successive memory cycles. Since the read operation has priority, a "0" will first be read from addr m 62 (i.e., R0 is inputted into Port 1), then a "1" is written into addr m 61 (i.e., W1 is inputted into Port 2) during the first cycle. In the next cycle, a "1" is read from addr m, then a "1" is written to addr m. In the third cycle, a "1" is read from addr m, and a "0" is written to addr m. During the fourth cycle, a "0" is read from addr m and a "0" is written into addr m. The address frequency controller 26 also asserts the signal COUNT during the fourth cycle at memory address addr m, which causes the address counter 28 to output a new address, addr n, at the start of the next cycle. The next four read/write operations from Port 1 and Port 2 are then performed at addr n (64 and 63). Thus, port arbitration is checked for Ports 1 and 2 of dual port memory array 50.

Figure 3:
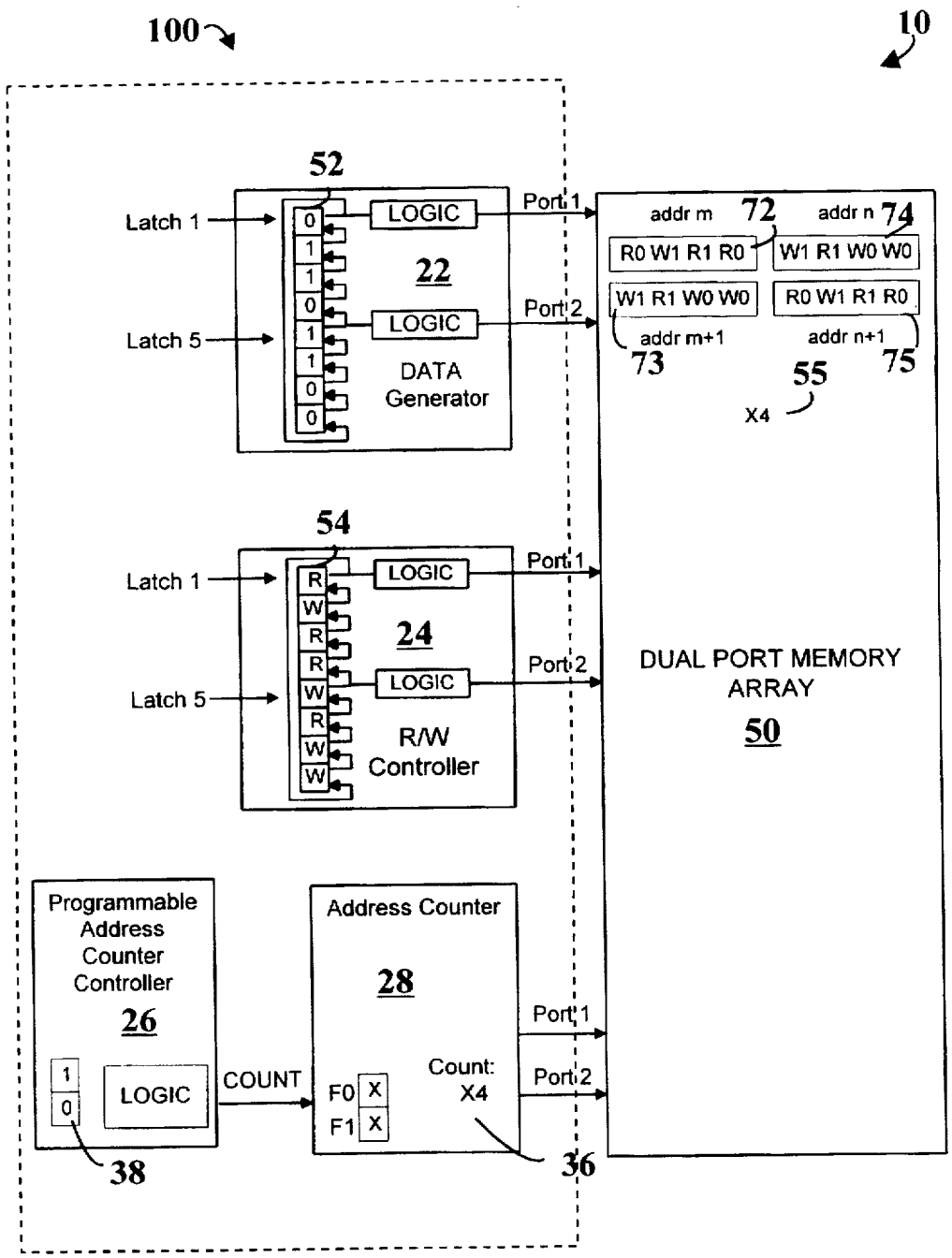
FIG. 3 is a block diagram illustrating one specific implementation of the programmable pattern generator of FIG. 1 to check cell-to-cell sensitivity.

FIG. 3 illustrates the testing of cell-to-cell sensitivity of a dual port memory array 50 by simultaneously applying unique R/W operations to adjacent addressed cells at addr m and addr m+1 of dual port memory array 50. As in the previous example, each programmable shift register 42 and 44 has two outputs, corresponding to the number of ports of the dual port memory array. One set of outputs is taken from Latch 1 of shift registers 52 and 54, and the other from Latch 5 of shift registers 52 and 54. The outputs of Latch 1 are fed into Port 1 while the outputs of latch 5 are fed into Port 2, thus allowing simultaneous operations on adjacent address cells.

One method used in this example for addressing adjacent cells is accomplished by inverting the Least Significant Word Address (LSWA) or Least Significant Bit Address (LSBA) on one port. For example, adjacent cell-to-cell sensitivity could be checked by performing four read ONE (R1) operations to a cell while simultaneously performing four write ZERO (W0) operations to an adjacent cell. This technique is also used in checking sensitivity between adjacent bit lines, or word lines, by simultaneously applying unique R/W operations to adjacent addressed bit lines or word lines.

In this example, as in the previous example, the frequency controller is in X4 mode. Thus, the first four read/write operations from Port 1 and Port 2 (72 and 73, respectively) are performed simultaneously at adjacent address locations addr m and addr m+1 in four successive cycles. For the first cycle, a "0" is read from addr m at the same time a "1" is written into addr m+1. Then, a "1" is written to addr m while a "1" is read from addr m+1. Next, a "1" is read from addr m, and a "0" is written to addr m+1. Finally, a "0" is read from addr m and a "0" is written into addr m+1. The next four read/write operations from Port 1 and Port 2 are then performed at different adjacent address locations addr n, and addr n+1 (74 and 75, respectively). Thus, cell-to-cell sensitivity is checked for Ports 1 and 2 of dual port memory array 50. Furthermore, the capability to invert one port's LSWA and LSBA at the address counter combined with having multi-output shift registers allow wordline and bitline sensitivities to be detected.

Figure 4:
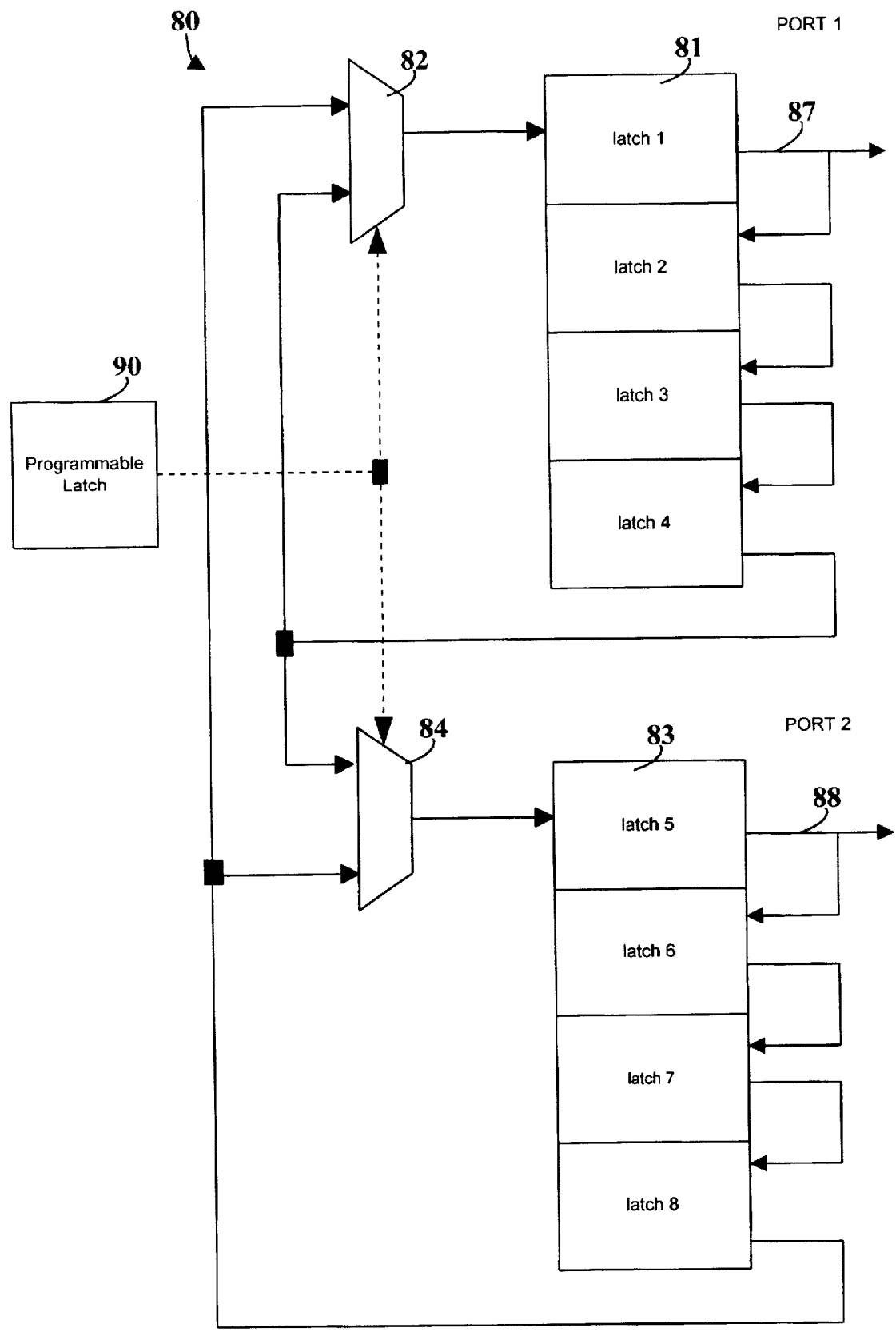
FIG. 4 illustrates a second embodiment of the shift register used in the data generator and R/W controller of FIG. 1.

FIG. 4 shows a second embodiment for the shift registers 32 and 34 of FIG. 1. In this embodiment, the 8-bit data shift register 32 (FIG. 1) and the 8-bit R/W control shift register 34 (FIG. 1) are configured into two 4-bit shift registers 81 and 83, respectively. Programmable latch 90, coupled to multiplexers 82 and 84, modify and multiplex the shift registers 81 and 83 lengths. The outputs of Latch 4 and Latch 8 of shift registers 81 and 83 are inputted into both multiplexers 82 and 84. Multiplexers 82 and 84 then provide inputs, depending on the status of the programmable latch 90, into Latch 1 of 4-bit shift register 81 and into Latch 5 of 4-bit shift register 83, respectively. These inputs are then outputted onto Port 1 and Port 2. Configured as such, data and R/W control applied to Port 1 can be totally unrelated to the data and R/W control presented to Port 2. This configuration also lends itself to testing two different groups of memory arrays in parallel with separate unique R/W data sequences by a single ABIST. Although two 4-bit shift registers are shown, it is also possible to create four 2-bit registers or other length registers by the addition of more multiplexers and/or data latches.

With the disclosed invention, unique operations can be applied to each port of a multi-port memory array while each port operates on the same or different address locations. Test coverage of multi-port memories is extended with trivial impact on chip area. With this implementation, $2^{16}$ possible patterns are available for detecting dual-port memory fault mechanisms. Furthermore, the capability to invert the port's LSWA and LSBA at the address counter combined with having multi-output shift registers allow wordline and bit-line sensitivities to be detected. Thus, this invention provides a single ABIST circuit that will simultaneously and thoroughly test multiple ports on a multi-port memory array, a plurality of single ports on single-port memory arrays, or a combination thereof.

While the invention has been particularly shown and described with reference to a preferred exemplary embodiment thereof, it will be understood by those skilled in the art that various changes in form and details may be made therein without departing from the spirit and scope of the invention. For example, expanding the number of bits in the data and read/write latches, or expanding the number of bits or states for the address frequency controller, in order to achieve an even higher number of possible sequences is expressly within the scope of the present invention. In addition, it will be understood that, while various of the conductors or connections are shown in the drawing as single lines, they are not so shown in a limiting sense, and may comprise plural conductors or connections, as is understood in the art.

What is claimed is:

1. An on-chip built-in test circuit for a memory array having multiple ports, said test circuit comprising:
   a data generator, coupled to said memory array, for providing a unique data at each of said multiple ports of said memory array;
   a read/write controller, coupled to said memory array, for providing a unique read/write control at each of said multiple ports of said memory array;
   an address counter, coupled to said memory array, for providing a unique address to each of said multiple ports of said memory array; and
   a frequency controller, coupled to said address counter, for providing a frequency at which said address counter updates said unique address applied at each of said multiple ports of said memory array,
   wherein each of said multiple ports simultaneously receive one said unique data, one said unique read/write control and one said address of said memory array for said one unique data and said one unique read/write control.

2. The circuit of claim 1, wherein said addresses of said address counter for said data and said read/write control are the same address to test port arbitration.

3. The circuit of claim 1, wherein said addresses of said address counter for said data and said read/write control are for adjacent memory addresses to test cell-to-cell, bitline and wordline coupling sensitivities.

4. The circuit of claim 1, wherein said data generator further comprises data latches forming a barrel shift register with a plurality of outputs taken from said barrel shift register.

5. The circuit of claim 1, wherein said read/write controller comprises read/write latches forming a read/write barrel shift register with a plurality of outputs taken from said read/write barrel shift register.

6. The circuit of claim 1, wherein said data generator further comprises data latches forming a plurality of shift registers and at least one programmable latch to multiplex the lengths said shift registers.

7. The circuit of claim 1, wherein said read/write controller further comprises R/W latches forming a plurality of read/write shift registers and at least one R/W programmable latch to multiplex the lengths of said R/W shift registers.

8. The circuit of claim 6, wherein said plurality of outputs of said data generator is equal in number to said multiple ports of said memory array.

9. A method for testing a memory array having multiple ports comprising the steps of:
   a) simultaneously providing a unique data, a unique read/write control and a unique address for said data and read/write control at each of said multiple ports of said memory array; and
   b) testing said memory array by comparing an output of said memory array with compare data provided by an on-chip built-in test circuit.

10. The method of claim 9, wherein step a) further comprises the step of: providing the same address for said data and said read/write control at each of said multiple ports to test port arbitration.

11. The method of claim 9, wherein step a) further comprises the step of: providing adjacent addresses for said data and said read/write control for each of said multiple ports to test cell-to-cell, bitline, and wordline coupling sensitivities.

12. The method of claim 9, wherein step a) further comprises the step of: providing said unique data and said unique read/write control from data latches and read/write latches, respectively, wherein said data latches and read/write latches form a data shift register and a read/write shift register, each having a plurality of outputs.

13. The method of claim 12, further comprises the step of: multiplexing the lengths of said data shift register and said read/write shift register with at least one programmable latch.

14. An integrated circuit having an on-chip built-in test circuit, said integrated circuit comprising:

- at least one memory array, each said memory array having at least one port;
- a data generator, coupled to said at least one memory array, for providing a unique data at each said port of each said memory array;
- a read/write controller, coupled to said at least one memory array, for providing a unique read/write control at each said port of each said memory array; and
- an address counter, coupled to said at least one memory array, for providing an address for said unique data and said unique read/write control applied at each said port of each said memory array, wherein each said port simultaneously receive one said unique data, one said unique read/write control and one said address of said memory array for said one unique data and said one unique read/write control.

15. The integrated circuit of claim 14, wherein said addresses of said address counter for said data and said read/write control are the same to test port arbitration.

16. The integrated circuit of claim 14, wherein said addresses of said address counter for said data and said read/write control are for adjacent addresses to test cell-to-cell, bitline, or wordline coupling sensitivities.

17. The integrated circuit of claim 14, wherein said data generator and said read/write controller further comprise data latches and read/write latches, respectively, said data latches forming a data barrel shift register and said read/write latches forming a read/write barrel shift register, each shift register having a plurality of outputs.

18. The integrated circuit of claim 14, wherein said data generator and said read/write controller further comprise:

- data latches and read/write latches, respectively, said data latches forming a plurality of data shift registers and said read/write latches forming a plurality of read/write shift registers; and
- at least one programmable latch to multiplex the lengths of said plurality of data and read/write shift registers.

19. The integrated circuit of claim 14, wherein said at least one memory array having at least one port is a plurality of memory arrays, each having a single port.

20. The integrated circuit of claim 14, wherein at least one of said at least one memory array has a plurality of ports.

* * * * *